(12) United States Patent
Foster (10) Patent No.: US 6,221,231 B1
(45) Date of Patent: *Apr. 24, 2001

(54) PROCESS FOR APPLYING PROTECTIVE AND DECORATIVE COATING ON AN ARTICLE

(75) Inventor: Dennis Foster, Carmel, IN (US)

(73) Assignee: Masco Corporation of Indiana, Indianapolis, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/264,361

(22) Filed: Mar. 8, 1999

Related U.S. Application Data (63) Continuation-in-part of application No. 08/890,628, filed on Jul. 9, 1997, now Pat. No. 5,879,532.

(51) Int. Cl.[7] .............. C23C 28/02; C25D 5/14; C25D 5/12; C25D 5/02
(52) U.S. Cl. .......... 205/192; 205/180; 205/181; 205/118; 205/120; 205/122
(58) Field of Search .................. 205/180, 181, 205/192, 118, 120, 122

(56) References Cited

U.S. PATENT DOCUMENTS

| 4,938,999 | * | 7/1990 | Jenkin | 427/252 |
| 5,879,532 | * | 3/1999 | Foster et al. | 205/192 |

* cited by examiner

Primary Examiner—Edna Wong
(74) Attorney, Agent, or Firm—Myron B. Kapustij; Lloyd D. Doigan (57) ABSTRACT

A method for depositing a multi-layered protective and decorative coating on an article comprising first depositing at least one coating layer on the article by electroplating, removing the electroplated article from the electroplating bath and subjecting it to pulse blow drying to produce a spot-free surface on the electroplated article, and then depositing, by chemical vapor deposition, at least one chemically vapor deposited coating layer on the electroplated article. The electroplated layers are selected from copper, nickel and chrome. The chemical vapor deposited layers are selected from non-precious refractory metals, non-precious refractory metal alloys, non-precious refractory metal compounds, and non-precious refractory metal alloy compounds.

22 Claims, 3 Drawing Sheets

_Fig-5_

_Fig-6_

PROCESS FOR APPLYING PROTECTIVE AND DECORATIVE COATING ON AN ARTICLE

RELATED APPLICATIONS

This application is a continuation-in-part of application Ser. No. 08/890,628, filed Jul. 9, 1997 now U.S. Pat. No. 5,879,532.

FIELD OF THE INVENTION

The present invention is directed to a method of applying protective and decorative coatings to articles.

BACKGROUND OF THE INVENTION

Providing an article such as, for example, a brass faucet or lock with a multilayered coating by depositing a first coating layer or series of coating layers by electroplating and then depositing a second coating layer or series of coating layers on the electroplated coating layer by physical vapor deposition is known in the art. Such a multilayered coating provides abrasion and corrosion protection to the article, is decorative, and levels off any imperfections such as nicks and scratches on the article. Thus, for example, a brass article having a duplex nickel layer comprised of bright nickel and semi-bright nickel electroplated thereon and a zirconium nitride layer deposited on the duplex nickel layer by physical vapor deposition is smooth, has improved abrasion and corrosion resistance, and has the color of polished brass.

It is generally the vapor deposited layer which provides the abrasion protection and decorative appearance. However, the vapor deposited coating layer is generally quite thin, typically in the range of from about one to 20 millionths of an inch. Due to the thinness of the vapor deposited coating any water spots or any other surface defects such as nickel or chrome stains from or caused by the electroplating process show through and indeed are accentuated by the thin vapor deposited coating. Even spots, stains or discolorations which are not visible to the naked eye on the electroplated article will become visible after the vapor deposited coating is applied.

It is thus currently necessary to thoroughly inspect, clean and dry each article as it comes out of the electroplating bath. One conventional way of cleaning the electroplated articles is to run the articles through a water based cleaning system and use nitrogen drying to dry the articles. This is quite expensive and not always successful. Another method involves hand drying and cleaning each individual article. This hand drying, while more effective than a nitrogen based drying system, is very labor intensive and, therefore, also quite expensive. Hand drying also involves handling the electroplated articles which may result in dropping or bumping the articles against other objects with consequent damage to the articles.

It would be very advantageous if an efficient and effective drying method for the electroplated articles were available which eliminated the problems associated with conventional, currently used cleaning and drying methods. It is an object of the instant invention to provide such a system.

SUMMARY OF THE INVENTION

The instant invention comprises a method of applying a multi layer protective and decorative coating to an article. The method involves first applying at least one coating layer by electroplating. The electroplated article is then removed from the electroplating bath and subjected to pulse blow drying for spot-free drying. Then at least one layer is vapor deposited on the electroplated article by chemical vapor deposition.

The electroplating comprises applying at least one layer selected from copper, nickel and chrome. The copper plating includes both alkaline copper plating and acid copper plating. The nickel plating includes the electroplating of bright nickel, semi-bright nickel, and a duplex nickel layer comprised of bright nickel and semi-bright nickel.

Before the electroplated article is subjected to a chemical vapor deposition process in order to apply at least one thin chemically vapor deposited coating layer onto the electroplated coating the article is pulse blow dried in order to remove any wet spots or nickel or chrome stains.

After pulse blow drying at least one coating layer is deposited by chemical vapor deposition onto the top electroplated layer. The vapor deposited layer or layers are selected from non-precious refractory metals, non-precious refractory metal alloys, non-precious refractory metal compounds, and non-precious refractory metal alloy compounds. The non-precious refractory metal compounds and non-precious refractory metal alloy compounds include the nitrides, oxides, carbides, carbonitrides, and reaction products of a refractory metal or refractory metal alloy, oxygen and nitrogen.

DESCRIPTION OF THE PREFERRED EMBODIMENT

The method of this invention is especially characterized by providing a decorative and protective chemically vapor deposited thin coating layer on an electroplated undercoating which is free of blemishes or imperfections such as water spots, nickel spots and chrome spots. These blemishes or imperfections are generally due to spots remaining on the electroplated surface of the article as a result of the electroplating process. When the thin vapor deposited coating layer is applied over these spots they are greatly accentuated by this thin chemical vapor deposited coating layer.

The method of the instant invention comprises first depositing on at least a portion of the surface of an article at least one electroplated coating layer, removing the electroplated article from the electroplating bath and subjecting it to pulse blow drying to remove any spots from the surface thereof, and applying, by chemical vapor deposition, at least one thin coating layer onto the clean and dry electroplated surface.

Figure 1:
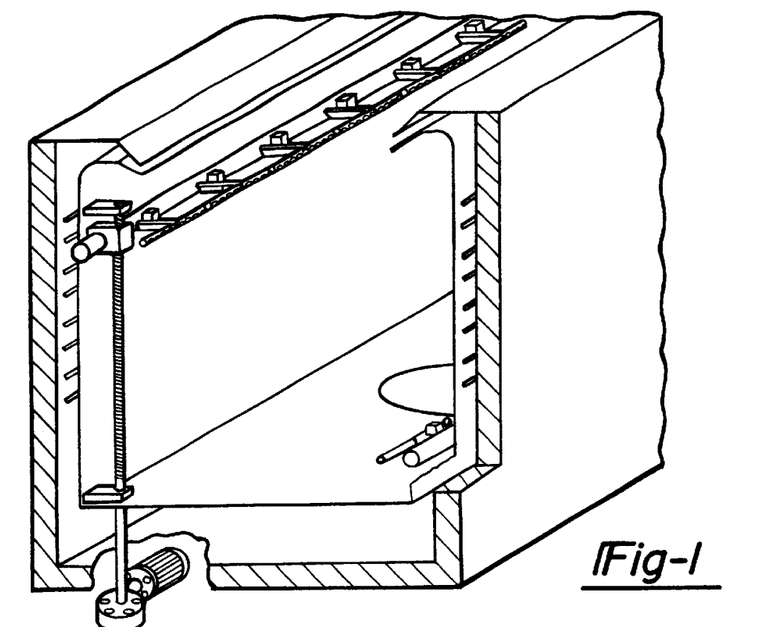
FIG. 1 is a cut away perspective view of a pulse blow dryer.

Pulse blow drying and a pulse blow dryer are described in European Patent 0 486 711, the disclosure of which is incorporated herein by reference. The pulse blow dryer is illustrated in FIG. 1. Briefly it comprises a housing similar to a conventional and well known circulating air drier. Ventilator, heating device, and air circulation shutters correspond to known and conventional designs. A movable nozzle device is additionally installed at each side of the station. The nozzle device is equipped with little nozzle pipes, about 150 mm long, and provided with 15 borings which correspond to the width of the travel direction. Each little nozzle pipe is supplied with air by means of solenoid valves. The solenoid valves are controlled by a microprocessor allowing the valves to be opened one after the other. The opening intervals can be adjusted between 20 and 100 ms via the control device. In case of wide driers, the valves are opened in groups, i.e. from 6–8 little nozzle pipes, one pipe is always open. The nozzle devices are moved up and down in opposite direction with an adjustable speed. The speed is normally approximately one to two strokes per minute. The stroke corresponds to the height of the rack plus 50 mm on top and bottom.

By the pulse-like connection of the individual little nozzle pipes to the compressed air supply with a nominal pressure of six bars, 15 air jets/pipe will result. These air jets atomize the water droplets on the surface of the parts. Due to the repeated blowing off of the surface of the articles with the pulsating air jets and stepping on from nozzle pipe to nozzle pipe in the horizontal position, one air jet is generated for approximately 1 cm$^2$ of surface.

The alternating passing and blowing-in of the sharp air jets into borings, blindholes, undercuts, and edges lead to a suction effect which removes the liquid even from the hollow spaces. This effect is so intense that even long borings in hollow parts, large interior spaces and threaded holes are dried well. When removing the parts from the racks, no water flows out from the hollow spaces and thus the quality of the surface is not spoiled by water stains.

A programmable control device allows a selection of the pulse frequency, the speed of the nozzle device, the number of valves simultaneously opened, the number of strokes, and the temperature. These parameters can be assigned to the articles to be treated. In a drying program, the speed and pulse frequency can be separately adjusted for every stroke. Large articles with a great drag-out can be blown off very quickly at the first stroke with short air pulses. The main quantity of adhesive water droplets is blown off here.

During the following strokes, the speed will be automatically reduced and the pulse frequency will be extended. The stronger air pulses and the valves opened for a longer period have a considerably better suction effect resulting in an improved drying of the hollow spaces.

As the main quantity of water is blown off, i.e. atomized, only a very thin adsorption layer remains to be dried up. Therefore, only short drying periods of two to five minutes are needed at a circulating air temperature of 50–70° C.

The pulse blow drying provides stainless drying. Thus electroplated articles can have a physical vapor deposited thin coating applied thereon without any further cleaning or drying of the electroplated articles.

The article can be comprised of any platable substrate such as metal or plastic. The metals that the article can be comprised of include brass, zinc, steel and aluminum. The electroplated coating which is deposited by electroplating on at least a portion of the surface of the article can be comprised of one layer or more than one layer. Preferred electroplated coatings include copper, including alkaline copper and acid copper, nickel, including bright nickel and semi-bright nickel, and chrome.

If the article is comprised of brass typically at least one nickel layer and chrome layer are electroplated on said article, with the nickel layer being deposited directly on the surface of the article and the chrome layer being deposited on the nickel layer. Brass articles can also have a copper layer applied directly on the surface thereof. At least one nickel layer is then electroplated on the copper layer. A chrome layer is then electroplated on the nickel layer.

The nickel layer is deposited on at least a portion of the surface of the substrate article by conventional and well known electroplating processes. These processes include using a conventional electroplating bath such as, for example, a Watts bath as the plating solution. Typically such baths contain nickel sulfate, nickel chloride, and boric acid dissolved in water. All chloride, sulfamate and fluoroborate plating solutions can also be used. These baths can optionally include a number of well known and conventionally used compounds such as leveling agents, brighteners, and the like. To produce specularly bright nickel layer at least one brightener from class I and at least one brightener from class II is added to the plating solution. Class I brighteners are organic compounds which contain sulfur. Class II brighteners are organic compounds which do not contain sulfur. Class II brighteners can also cause leveling and, when added to the plating bath without the sulfur-containing class I brighteners, result in semi-bright nickel deposits. These class I brighteners include alkyl naphthalene and benzene sulfonic acids, the benzene and naphthalene di- and trisulfonic acids, benzene and naphthalene sulfonamides, and sulfonamides such as saccharin, vinyl and allyl sulfonamides and sulfonic acids. The class II brighteners generally are unsaturated organic materials such as, for example, acetylenic or ethylenic alcohols, ethoxylated and propoxylated acetylenic alcohols, coumarins, and aldehydes. These class I and class II brighteners are well known to those skilled in the art and are readily commercially available. They are described, inter alia, in U.S. Pat. No. 4,421,611 incorporated herein by reference.

The nickel layer can be a monolithic layer comprised of, for example, semi-bright nickel or bright nickel; or it can be a duplex layer containing a layer comprised of semi-bright nickel and a layer comprised of bright nickel. The thickness of the nickel layer is generally in the range of from about 100 millionths (0.000100) of an inch, preferably about 150 millionths (0.000150) of an inch to about 3,500 millionths (0.0035) of an inch.

As is well known in the art before the nickel layer is deposited on the substrate the substrate is subjected to said activation by being placed in a conventional and well known acid bath.

Figure 2:
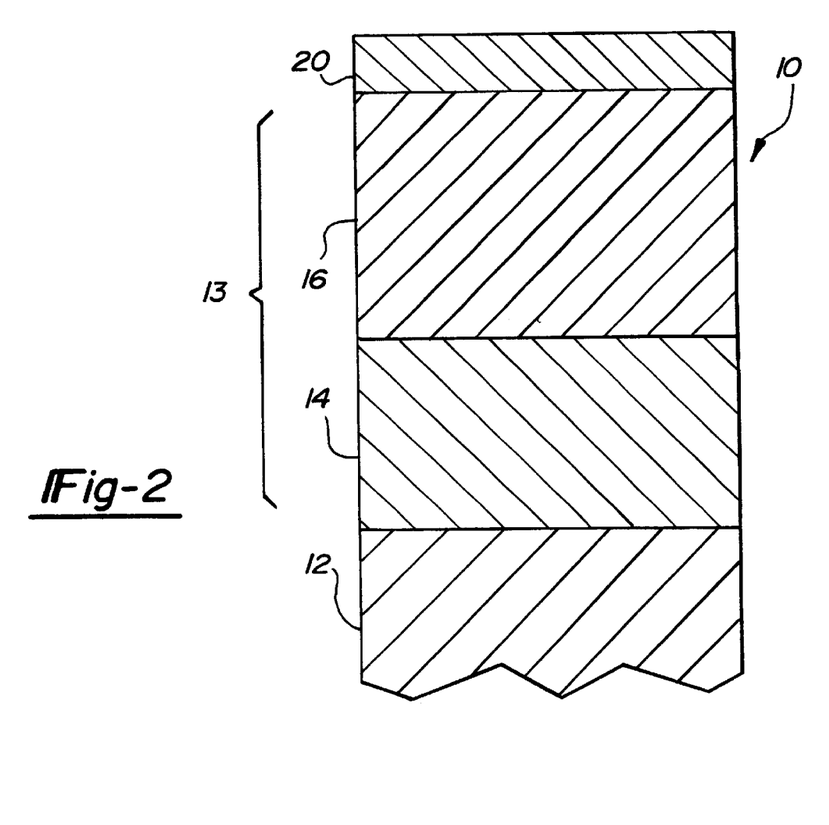
FIG. 2 is a cross-sectional view, not to scale, of a portion of the substrate having the electroplated coating layers thereon.

In one embodiment as illustrated in FIG. 2, the nickel layer 13 is actually comprised of two different nickel layers 14 and 16. Layer 14 is comprised of semi-bright nickel while layer 16 is comprised of bright nickel. This duplex nickel deposit provides improved corrosion protection to the underlying substrate. The semi-bright, sulfur-free plate 14 is deposited, by conventional electroplating processes, directly on the surface of the article substrate 12. The substrate 12 containing the semi-bright nickel layer 14 is then placed in a bright nickel plating bath and the bright nickel layer 16 is deposited on the semi-bright nickel layer 14.

The thickness of the semi-bright nickel layer and the bright nickel layer is a thickness effective to provide improved corrosion protection. Generally, the thickness of the semi-bright nickel layer is at least about 50 millionths (0.00005) of an inch, preferably at least about 100 millionths (0.0001) of an inch, and more preferably at least about 150 millionths (0.00015) of an inch. The upper thickness limit is generally not critical and is governed by secondary considerations such as cost. Generally, however, a thickness of about 1,500 millionths (0.0015) of an inch, preferably about 1,000 millionths (0.001) of an inch, and more preferably about 750 millionths (0.00075) of an inch should not be exceeded. The bright nickel layer 16 generally has a thickness of at least about 50 millionths (0.00005) of an inch, preferably at least about 125 millionths (0.000125) of an inch, and more preferably at least about 250 millionths (0.00025) of an inch. The upper thickness range of the bright nickel layer is not critical and is generally controlled by considerations such as cost. Generally, however, a thickness of about 2,500 millionths (0.0025) of an inch, preferably about 2,000 millionths (0.002) of an inch, and more preferably about 1,500 millionths (0.0015) of an inch should not be exceeded. The bright nickel layer 16 also functions as a leveling layer which tends to cover or fill in imperfections in the substrate.

In another embodiment of the invention as illustrated in FIG. 2 a chrome layer 20 is electroplated onto the nickel layer 13. The chrome layer 20 may be deposited on the nickel layer 13 by conventional and well known chromium electroplating techniques. These techniques, along with various chrome plating baths, are disclosed in Brassard, Decorative Electroplating—A Process in Transition, Metal Finishing, pp. 105–108, June 1988; Zaki, Chromium Plating, PF Directory, pp. 146–160; and in U.S. Pat. Nos. 4,460,438, 4,234,396, and 4,093,522, all of which are incorporated herein by reference.

Chrome plating baths are well known and commercially available. A typical chrome plating bath contains chromic acid or salts thereof, and catalyst ion such as sulfate or fluoride. The catalyst ions can be provided by sulfuric acid or its salts and fluosilicic acid. The baths may be operated at a temperature of about 112°–116° F. Typically in chrome plating a current density of about 150 amps per square foot, at about 5 to 9 volts is utilized.

The chrome layer generally has a thickness of at least about 2 millionths (0.000002) of an inch, preferably at least about 5 millionths (0.000005) of an inch, and more preferably at least about 8 millionths (0.000008) of an inch. Generally, the upper range of thickness is not critical and is determined by secondary considerations such as cost. However, the thickness of the chrome layer should generally not exceed about 60 millionths (0.00006) of an inch, preferably about 50 millionths (0.00005) of an inch, and more preferably about 40 millionths (0.00004) of an inch.

Figure 3:
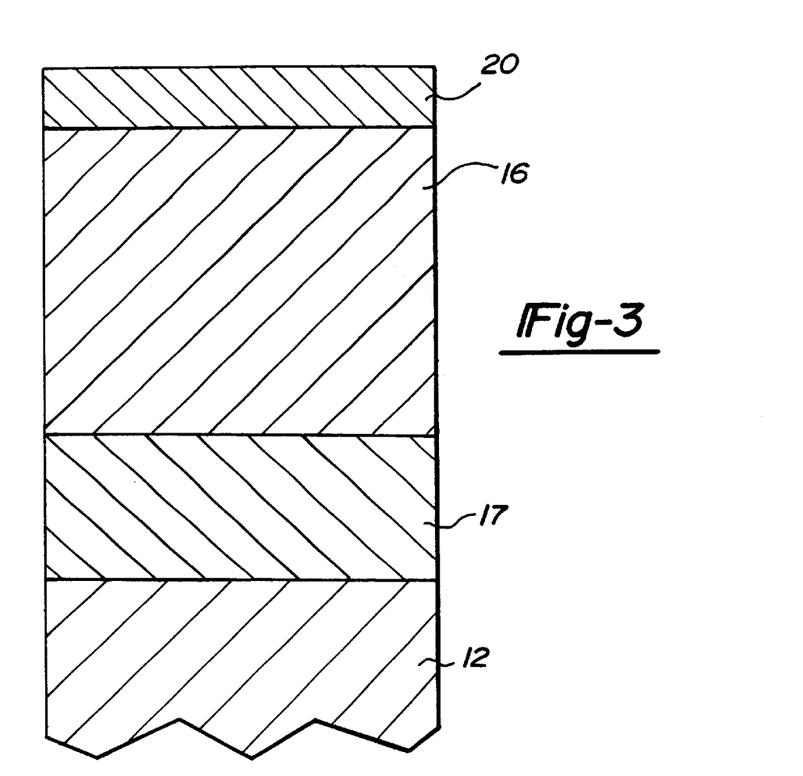
FIG. 3 is a view similar to FIG. 2 but showing another embodiment of the invention with a different arrangement of the electroplated coating layers.

In another embodiment of the invention, as illustrated in FIG. 3, especially when the substrate article is comprised of zinc or brass, a copper layer 17 or layers are electroplated on at least a portion of the article surface 12. Nickel layer 16 is then electroplated on the copper followed by electroplating of chrome 20 on the nickel layer. The nickel layer may be a monolithic layer as illustrated in FIG. 3 and comprised of, for example, bright nickel or it may be a duplex nickel layer comprised of, for example, a bright nickel layer and a semi-bright nickel layer. The copper coating 17 may be comprised of a monolithic copper layer or two different copper layers, for example, an alkaline copper layer on the surface of the article and an acid copper layer on the alkaline copper layer. In the embodiment illustrated in FIG. 3 the copper coating 17 is a monolithic copper layer comprised of acid copper.

Copper electroplating processes and copper electroplating baths are conventional and well known in the art. They include the electroplating of acid copper and alkaline copper. They are described, inter alia, in U.S. Pat. Nos. 3,725,220; 3,769,179; 3,923,613; 4,242,181 and 4,877,450, the disclosures of which are incorporated herein by reference.

The preferred copper layer is selected from alkaline copper and acid copper. The copper layer may be monolithic and consist of one type of copper such as alkaline copper or acid copper, or it may comprise two different copper layers such as a layer comprised of alkaline copper 11a (not shown) and a layer comprised of acid copper 11b (not shown).

The thickness of the copper layer is generally in the range of from at least about 100 millionths (0.0001) of an inch, preferably at least about 150 millionths (0.00015) of an inch to about 3,500 millionths (0.0035), preferably about 2,000 millionths (0.002) of an inch.

When a duplex copper layer is present comprised of, for example, an alkaline copper layer and an acid copper layer, the thickness of the alkaline copper layer is generally at least about 50 millionths (0.00005) of an inch, preferably at least about 75 millionths (0.000075) of an inch. The upper thickness limit is generally not critical. Generally, a thickness of about 1,500 millionths (0.0015) of an inch, preferably about 1,000 millionths (0.001) of an inch should not be exceeded. The thickness of the acid copper layer is generally at least about 50 millionths (0.0005) of an inch, preferably at least about 75 millionths (0.00075) of an inch. The upper thickness limit is generally not critical. Generally, a thickness of about 1,500 millionths (0.0015) of an inch, preferably about 1,000 millionths (0.001) of an inch should not be exceeded.

Some illustrative, non-limiting examples of electroplated layers include substrate/nickel such as bright nickel/chrome, substrate/semi-bright nickel/bright nickel/chrome, substrate/nickel such as bright nickel, substrate/semi-bright nickel/bright nickel, substrate/copper such as acid copper/nickel such as bright nickel/chrome, substrate/alkaline copper/acid copper/nickel such as bright nickel/chrome, substrate/copper such as alkaline copper/semi-bright nickel/bright nickel/chrome, substrate/alkaline copper/acid copper/semi-bright nickel/bright nickel/chrome, substrate/copper such as acid copper/nickel such as bright nickel, substrate/copper such as alkaline copper/semi-bright nickel/bright nickel, and substrate/alkaline copper/acid copper/semi-bright nickel/bright nickel.

After the article has had the various electroplated coating layers, as exemplified supra and in FIGS. 2 and 3, deposited thereon by electroplating it is then subjected to pulse blow drying to blow off any spots, stains, moisture or droplets and produce an electroplated article having a stainless top surface. After completion of the pulse blow drying the electroplated article is placed in a physical vapor deposition chamber and one or more thin coating layers are deposited by physical vapor deposition on the surface of the electroplated article.

The layers which are deposited by chemical vapor deposition are selected from non-precious refractory metals, non-precious refractory metal alloys, non-precious refractory metal compounds, and non-precious refractory metal alloy compounds. The non-precious refractory metals include hafnium, tantalum, titanium and zirconium. The preferred refractory metals are titanium and zirconium, with zirconium being more preferred. The non-precious refractory metal alloys include the alloys of the above mentioned refractory metals with the binary alloys being preferred. The preferred binary alloys are the binary alloys of zirconium, with the binary alloys of zirconium and titanium being more preferred.

The non-precious refractory metal and metal alloy compounds include the nitrides, oxides, carbides and carbonitrides of the non-precious refractory metals and metal alloys. Also included among the non-precious refractory metal and metal alloy compounds useful in the instant invention are the reaction products of a non-precious refractory metal or metal alloy, oxygen and nitrogen. Examples of these non-precious refractory metal compounds include zirconium nitride, zirconium oxide, zirconium carbide, zirconium carbonitride, reaction products of zirconium, oxygen and nitrogen, titanium nitride, titanium oxide, titanium carbonitride, reaction products of titanium, oxygen and nitrogen, hafnium nitride, hafnium oxide, hafnium carbonitride, tantalum oxide, tantalum nitride, tantalum carbide, and the like.

The reaction products of a non-precious refractory metal, such as for example zirconium, oxygen and nitrogen comprise zirconium oxide, zirconium nitride and zirconium oxy-nitride.

Some illustrative non-limiting examples of the non-precious refractory metal alloy compounds include zirconium-titanium nitride, zirconium-titanium oxide, zirconium-titanium carbide, zirconium-titanium carbonitride, hafnium-zirconium nitride, hafnium-tantalum oxide, tantalum-titanium carbide, and reaction products of zirconium-titanium alloy, oxygen and nitrogen.

The layers comprised of refractory metals and refractory metal alloys are deposited on at least a portion of the surface of the electroplated article by conventional and well known chemical vapor deposition processes. Chemical vapor deposition (CVD) is defined as the formation of a non-volatile solid film on a substrate by the reaction of vapor phase reactants that contain desired components. The gases are introduced into a reactor vessel, and decompose and react at a heated surface on the substrate to form the desired film.

CVD is generally classified into one of three types. The first two are principally predicated upon reactor pressure, and are designated as atmospheric pressure chemical vapor deposition (APCVD) or low pressure chemical vapor deposition (LPCVD).

A third category is referred to as plasma enhanced chemical vapor deposition (PECVD). Rather than relying solely on thermal energy to initiate and sustain chemical reactions, PECVD uses a radio frequency (RF) induced glow discharge or direct current or microwaves to transfer energy into the reactant gases, allowing the substrate to remain at lower temperature than in APCVD or LPCVD processes. Specifically, the plasma-inducing glow discharge is generated by the application of an RF field to a low pressure gas, thereby creating free electrons within the discharge region. The electrons gain sufficient energy from the electric field so that when they collide with gas molecules, gas-phase dissociation and ionization of the reactant gases (i.e., inducement into the plasma state) then occurs. Lower substrate temperature is the major advantage of PECVD, and provides a method of depositing films on some substrates which do not have a thermal stability to accept coating by other methods. In addition, PECVD can enhance the deposition rate when compared to thermal reactions alone, and produces films of unique compositions and properties.

In a CVD process, a substrate is placed within a reaction chamber containing one or more reactant gases. Chemical reactions occurring between the reactant gases result in the formation of a layer of a desired solid material upon the exposed surfaces of the substrate. CVD processes are disclosed, inter alia, in U.S. Pat. Nos. 5,782,980; 5,824,365; 5,254,499 and 5,571,572, all of which are incorporated herein by reference.

Generally, more than one layer comprised of refractory metal, refractory metal alloy, refractory metal compound and refractory metal alloy compound is deposited on the electroplated article. Thus, for example, a layer comprised of refractory metal or refractory metal alloy such as zirconium is vapor deposited on the electroplated article; a sandwich layer comprised of alternating layers of refractory metal or refractory metal alloy such as zirconium and refractory metal compound or refractory metal alloy compound such as zirconium nitride is then deposited on the zirconium layer; and a layer comprised of the reaction products of a refractory metal or refractory metal alloy such as zirconium, oxygen and nitrogen is deposited on the sandwich layer.

In another embodiment a layer comprised of a first refractory metal compound or refractory metal alloy compound, preferably a nitride, is vapor deposited on the refractory metal or refractory metal alloy layer. A layer comprised of a different second refractory metal compound or refractory metal alloy compound, preferably an oxide or the reaction products of a refractory metal or refractory metal alloy, oxygen and nitrogen, is then vapor deposited on said first refractory metal compound or refractory metal alloy compound layer.

Generally the refractory metal or refractory metal alloy layer has a thickness of at least about 0.25 millionths (0.00000025) of an inch, preferably at least about 0.5 millionths (0.0000005) of an inch, and more preferably at least about one millionth (0.000001) of an inch. The upper thickness range is not critical and is generally dependent upon considerations such as cost. Generally, however, the layer comprised of refractory metal or refractory metal alloy should not be thicker than about 50 millionths (0.00005) of an inch, preferably about 15 millionths (0.000015) of an inch, and more preferably about 10 millionths (0.000010) of an inch.

Generally the refractory metal or refractory metal alloy layer functions, inter alia, to improve the adhesion of a layer comprised of refractory metal compound, refractory metal alloy compound, reaction products of refractory metal or refractory metal alloy, oxygen and nitrogen to the electroplated article. Thus, the refractory metal or refractory metal alloy layer generally has a thickness which is at least effective to improve the adhesion of a layer comprised of refractory metal compound, refractory metal alloy compound, and reaction products of a refractory metal or refractory metal alloy, oxygen and nitrogen to the electroplated article.

In a preferred embodiment of the present invention the refractory metal layer is comprised of zirconium, titanium, or zirconium-titanium alloy, preferably zirconium or zirconium-titanium alloy, and is deposited by physical vapor deposition processes such as, for example, ion sputtering or electron beam evaporation.

The layer comprised of refractory metal compound, refractory metal alloy compound, or reaction products of refractory metal or refractory metal alloy compound, oxygen and nitrogen generally has a thickness which is at least about 2 millionths (0.000002) of an inch, preferably at least about 4 millionths (0.000004) of an inch, and more preferably at least about 6 millionths (0.000006) of an inch. The upper thickness range is generally not critical and is dependent upon considerations such as cost. Generally a thickness of about 30 millionths (0.00003) of an inch, preferably about 25 millionths (0.000025) of an inch, and more preferably about 20 millionths (0.000020) of an inch should not be exceeded.

This layer generally provides wear resistance, abrasion resistance and the desired color or appearance. This layer is preferably comprised of zirconium nitride or zirconium-titanium alloy nitride which has the color of brass. The thickness of this layer is at least effective to provide wear resistance, abrasion resistance, and the desired color or appearance.

Figure 4:
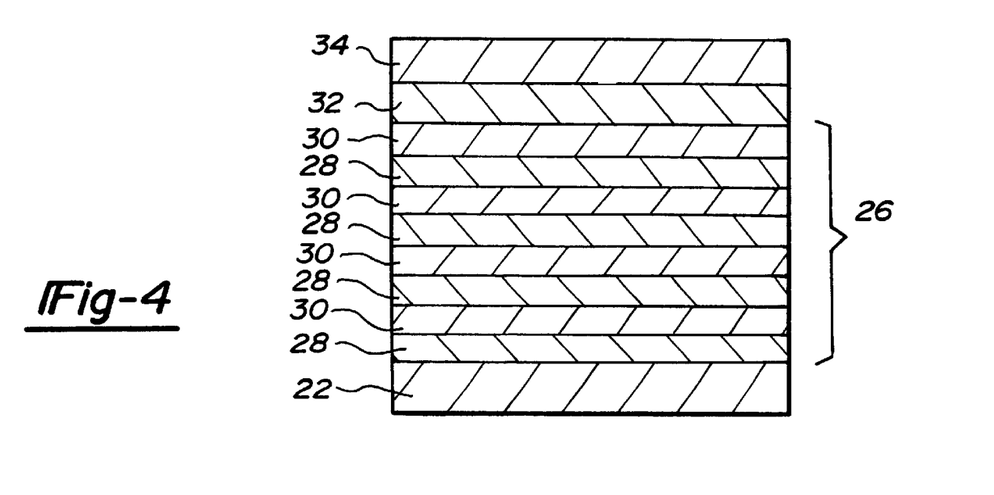
FIG. 4 is a cross-sectional view, not to scale, showing one arrangement of the chemical vapor deposited layers.

In another embodiment of the invention a sandwich layer comprised of alternating layers of a non-precious refractory metal compound or non-precious refractory metal alloy compound and a non-precious refractory metal or non-precious refractory metal alloy is deposited over the refractory metal or refractory metal alloy layer such as zirconium or zirconium-titanium alloy. An exemplary structure of this embodiment is illustrated in FIG. 4 wherein 22 represents the refractory metal or refractory metal alloy layer, preferably zirconium or zirconium-titanium alloy, 26 represents the sandwich layer, 28 represents a non-precious refractory metal compound layer or non-precious refractory metal alloy compound layer, and 30 represents a non-precious refractory metal layer or non-precious refractory metal alloy layer.

The non-precious refractory metals and non-precious refractory metal alloys comprising layers 30 include hafnium, tantalum, titanium, zirconium, zirconium-titanium alloy, zirconium-hafnium alloy, and the like; preferably zirconium, titanium, or zirconium-titanium alloy; and more preferably zirconium or zirconium-titanium alloy.

The non-precious refractory metal compounds and non-precious refractory metal alloy compounds comprising layers 28 include hafnium compounds, tantalum compounds, titanium compounds, zirconium compounds, and zirconium-titanium alloy compounds; preferably titanium compounds, zirconium compounds, or zirconium-titanium alloy compounds; and more preferably zirconium compounds or zirconium-titanium alloy compounds. These compounds are selected from nitride, carbides and carbonitrides, with the nitride being preferred. Thus, the titanium compound is selected from titanium nitrides, titanium carbide and titanium carbonitride, with titanium nitride being preferred. The zirconium compound is selected from zirconium nitride, zirconium carbide and zirconium carbonitride, with zirconium nitride being preferred.

The sandwich layer 26 generally has an average thickness of from about 50 millionths (0.00005) of an inch to about one millionth (0.000001) of an inch, preferably from about 40 millionths (0.00004) of an inch to about two millionths (0.000002) of an inch, and more preferably from about 30 millionths (0.00003) of an inch to about three millionths (0.000003) of an inch.

Each of layers 28 and 30 generally has a thickness of at least about 0.002 millionths (0.00000002) of an inch, preferably at least about 0.1 millionths (0.0000001) of an inch, and more preferably at least about 0.5 millionths (0.0000005) of an inch. Generally, layers 28 and 30 should not be thicker than about 25 millionths (0.000025) of an inch, preferably about 10 millionths (0.00001) of an inch, and more preferably about 5 millionths (0.000005) of an inch.

The number of alternating layers of refractory metal 30 and refractory metal compound layers 28 in sandwich layer 26 is generally at least about 2, preferably at least about 4, and more preferably at least about 6. Generally, the number of alternating layers of refractory metal 30 and refractory metal compound 30 in sandwich layer 26 should not exceed about 50, preferably about 40, and more preferably about 30.

In one embodiment of the invention, as illustrated in FIG. 4, chemically vapor deposited over the sandwich layer 26 is a layer 32 comprised of a non-precious refractory metal compound or non-precious refractory metal alloy compound, preferably a nitride, carbide or carbonitride, and more preferably a nitride.

Layer 32 is comprised of a hafnium compound, a tantalum compound, a titanium compound, a zirconium-titanium alloy compound, or a zirconium compound, preferably a titanium compound, a zirconium-titanium alloy compound, or a zirconium compound, and more preferably a zirconium compound or a zirconium-titanium alloy compound. The titanium compound is selected from titanium nitride, titanium carbide, and titanium carbonitride, with titanium nitride being preferred. The zirconium compound is selected from zirconium nitride, zirconium carbonitride, and zirconium carbide, with zirconium nitride being preferred.

Layer 32 provides wear and abrasion resistance and the desired color or appearance, such as for example, polished brass. Layer 32 is deposited on layer 26 by any of the well known and conventional physical vapor deposition techniques such as reactive ion sputtering.

Layer 32 has a thickness at least effective to provide abrasion resistance and/or the color of brass. Generally, this thickness is at least 2 millionths (0.000002) of an inch, preferably at least 4 millionths (0.000004) of an inch, and more preferably at least 6 millionths (0.000006) of an inch. The upper thickness range is generally not critical and is dependent upon considerations such as cost. Generally a thickness of about 30 millionths (0.00003) of an inch, preferably about 25 millionths (0.000025) of an inch, and more preferably about 20 millionths (0.000020) of an inch should not be exceeded.

Zirconium nitride is the preferred coating material as it most closely provides the appearance of polished brass.

In yet another embodiment a refractory metal alloy layer is deposited on the electroplated layer and then a refractory metal compound or refractory metal alloy compound, such as for example zirconium nitride, zirconium-titanium alloy nitride, titanium carbide, or zirconium carbonitride layer is deposited on the refractory metal or refractory metal alloy layer. In this embodiment there is no sandwich layer 26 but layer 32 is deposited directly on the layer comprised of refractory metal or refractory metal alloy.

In one embodiment of the invention, as illustrated in FIG. 4, a layer 34 comprised of the reaction products of a non-precious refractory metal or metal alloy, an oxygen containing gas such as oxygen, and nitrogen is deposited onto layer 32. The metals that may be employed in the practice of this invention are those which are capable of forming both a metal oxide and a metal nitride under suitable conditions, for example, using a reactive gas comprised of oxygen and nitrogen. The metals may be, for example, tantalum, hafnium, zirconium, zirconium-titanium alloy, and titanium, preferably titanium, zirconium-titanium alloy and zirconium, and more preferably zirconium and zirconium-titanium alloy.

The reaction products of the metal or metal alloy, oxygen and nitrogen are generally comprised of the metal or metal alloy oxide, metal or metal alloy nitride and metal or metal alloy oxy-nitride. Thus, for example, the reaction products of zirconium, oxygen and nitrogen comprise zirconium oxide, zirconium nitride and zirconium oxy-nitride.

The layer 34 can be deposited by a well known and conventional chemical vapor deposition techniques.

These metal oxides and metal nitride including zirconium oxide and zirconium nitride alloys and their preparation and deposition are conventional and well known and are disclosed, inter alia, in U.S. Pat. No. 5,367,285, the disclosure of which is incorporated herein by reference.

The metal, oxygen and nitrogen reaction products containing layer 34 generally has a thickness of at least about 0.1 millionths (0.0000001) of an inch, preferably at least about 0.15 millionths (0.00000015) of an inch, and more preferably at least about 0.2 millionths (0.0000002) of an inch. Generally, the metal oxynitride layer should not be thicker than about one millionth (0.000001) of an inch, preferably about 0.5 millionths (0.0000005) of an inch, and more preferably about 0.4 millionths (0.0000004) of an inch.

Figures 5, 6:
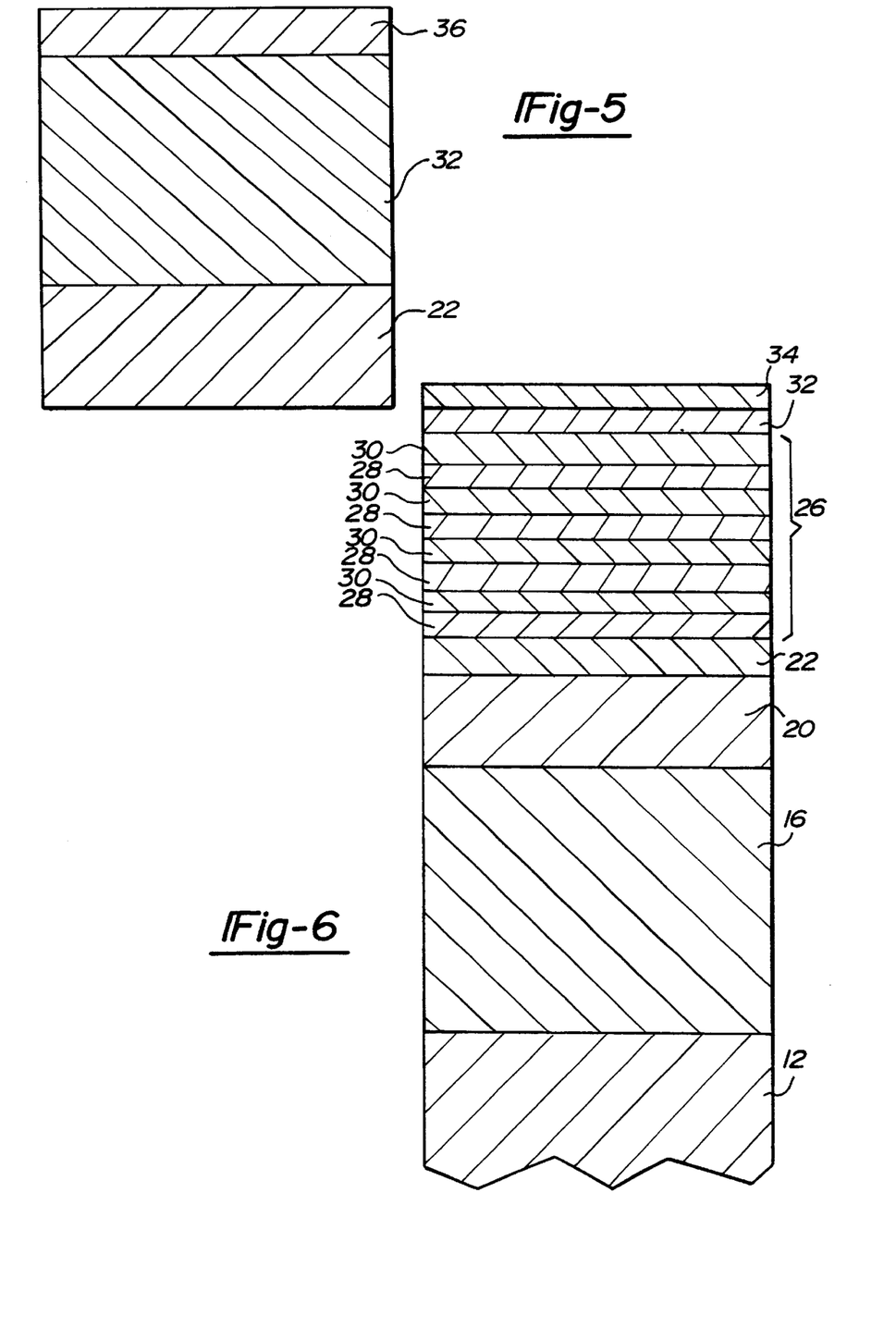
FIG. 5 is a view similar to FIG. 4 but showing another embodiment of the invention with a different arrangement of different chemical vapor deposited layers.
FIG. 6 is a cross-sectional view, not to scale, of a portion of the substrate having the electroplated and chemical vapor deposited coating layers thereon.

In another embodiment, as illustrated in FIG. 5, instead of the layer 34 comprised of the reaction products of a refractory metal or refractory metal alloy, oxygen and nitrogen being deposited on layer 32 a layer 36 comprised of nonprecious refractory metal oxide or refractory metal alloy oxide is applied by chemical vapor deposition onto layer 32. The refractory metal oxides and refractory metal alloy oxides of which layer 36 is comprised include, but are not limited to, hafnium oxide, tantalum oxide, zirconium oxide, titanium oxide, and zirconium-titanium alloy oxide, preferably titanium oxide, zirconium oxide, and zirconium-titanium alloy oxide, and more preferably zirconium oxide and zirconium-titanium alloy oxide.

Layer 36 has a thickness of at least about 0.1 millionths (0.0000001) of an inch, preferably at least about 0.15 millionths (0.00000015) of an inch, and more preferably at least about 0.2 millionths (0.0000002) of an inch. Generally the metal or metal alloy oxide layer 36 should not be thicker than about 2 millionths (0.000002) of an inch, preferably about 1.5 millionths (0.0000015) of an inch, and more preferably about one millionth (0.000001) of an inch.

FIG. 6 illustrates an article substrate 12 having a bright nickel layer 16 electroplated on its surface and a chrome layer 20 electroplated on the bright nickel layer 16. On the electroplated chrome layer are deposited by chemical vapor deposition, after the substrate article 12 having electroplated layers 16 and 20 thereon has been subjected to pulse blow drying, layer 22 comprised of zirconium, sandwich layer 26 comprised of alternating layers 28 and 30 comprised of, respectively, zirconium nitride and zirconium, layer 32 comprised of zirconium nitride, and layer 34 comprised of the reaction products of zirconium, oxygen and nitrogen.

In order that the invention may be more readily understood the following example is provided. The example is illustrative and does not limit the invention thereof.

EXAMPLE I

Brass faucets are placed in a conventional soak cleaner bath containing the standard and well known soaps, detergents, defloculants and the like which is maintained at a pH of 8.9–9.2 and a temperature of 180–200° F. for about 10 minutes. The brass faucets are then placed in a conventional ultrasonic alkaline cleaner bath. The ultrasonic cleaner bath has a pH of 8.9–9.2, is maintained at a temperature of about 160–180° F., and contains the conventional and well known soaps, detergents, defloculants and the like. After the ultrasonic cleaning the faucets are rinsed and placed in a conventional alkaline electro cleaner bath. The electro cleaner bath is maintained at a temperature of about 140–180° F., a pH of about 10.5–11.5, and contains standard and conventional detergents. The faucets are then rinsed twice and placed in a conventional acid activator bath. The acid activator bath has a pH of about 2.0–3.0, is at an ambient temperature, and contains a sodium fluoride based acid salt. The faucets are then rinsed twice and placed in a bright nickel plating bath for about 12 minutes. The bright nickel bath is generally a conventional bath which is maintained at a temperature of about 130–150° F., a pH of about 4.0, contains $NiSO_4$, $NiCl_2$, boric acid, and brighteners. A bright nickel layer of an average thickness of about 400 millionths (0.0004) of an inch is deposited on the faucet surface. The bright nickel plated faucets are rinsed three times and then placed in a conventional, commercially available hexavalent chromium plating bath using conventional chromium plating equipment for about seven minutes. The hexavalent chromium bath is a conventional and well known bath which contains about 32 ounces/gallon of chromic acid. The bath also contains the conventional and well known chromium plating additives. The bath is maintained at a temperature of about 112–116° F., and utilizes a mixed sulfate/fluoride catalyst. The chromic acid to sulfate ratio is about 200:1. A chromium layer of about 10 millionths (0.00001) of an inch is deposited on the surface of the bright nickel layer. The faucets are thoroughly rinsed in deionized water.

The electroplated faucets are placed on a rack and the rack moves through a pulse blow dryer manufactured by LPW-Anlagen GmbH of Germany and described in European patent application EP 0486 711 A1. The blow dryer is equipped with a row of small nozzles which emit pulsating air jets at 80 psi. The dryer is maintained at a temperature of 130° F. The electroplated faucets remain in the pulse blow dryer a total of 210 seconds, with the rack moving through the dryer two feet in five seconds. The rack remains motionless for 37 seconds and then advances again. The pulses last for about 20 miliseconds. The faucets are removed from the pulse blow dryer and are placed in a chemical vapor deposition reactor. A layer of zirconium having an average thickness of about four millionths (0.000004) of an inch is deposited by chemical vapor deposition on the chrome plated faucets. After the zirconium layer is deposited a zirconium nitride "color layer" is deposited thereon by chemical vapor deposition.

Although the invention has been disclosed in terms of preferred embodiments, it will be understood that numerous variations could be made thereto, without departing from the spirit and scope of the invention as set forth in the following claims.

What is claimed is:

1. A process of depositing a multi layer coating containing a metal or a metal alloy on at least a portion of an article surface comprising:

depositing by electroplating at least one electroplated metal or metal alloy layer on at least a portion of said article surface;

subjecting said article having said at least one electroplated layer on at least a portion of its surface to pulses of air to dry said article surface and remove any liquid spots therefrom; and depositing by chemical vapor deposition at least one layer selected from the group consisting of refractory metal and refractory metal alloy and at least one layer selected from the group consisting of refractory metal compound and refractory metal alloy compound on at least a portion of said electroplated layer, wherein said refractory metal compound is selected from the group consisting of nitrides, carbides, carbonitrides, oxides and reaction products of said refractory metal, oxygen and nitrogen, and wherein said refractory metal alloy compound is selected from the group consisting of nitrides, carbides, carbonitrides, oxides and reaction products of refractory metal alloy, oxygen and nitrogen.

2. The process of claim 1 wherein said electroplating comprises electroplating at least one layer selected from copper, nickel and chrome on said at least a portion of said article surface.

3. The process of claim 2 wherein said refractory metal is selected from the group consisting of zirconium, titanium and hafnium and said refractory metal alloy is zirconium-titanium alloy.

4. The process of claim 2 wherein said electroplating comprises electroplating at least one layer comprised of nickel on said at least a portion of said surface of said article to provide at least one electroplated nickel layer.

5. The process of claim 2 wherein said electroplating comprises electroplating at least one layer comprised of nickel on said at least a portion of said surface of said article to provide at least one electroplated nickel layer, and electroplating at least one layer comprised of chrome on said at least one electroplated nickel layer to provide at least one electroplated chrome layer.

6. The process of claim 5 wherein said at least one layer selected from refractory metal and refractory metal alloy is vapor deposited on said at least a portion of said electroplated chrome layer.

7. The process of claim 6 wherein said refractory metal is selected from the group consisting of zirconium and titanium and said refractory metal alloy is zirconium-titanium alloy.

8. The process of claim 7 wherein said refractory metal is zirconium, and said refractory metal alloy is zirconium-titanium alloy.

9. The process of claim 8 wherein a sandwich layer comprised of alternating layers of zirconium or zirconium-titanium alloy and zirconium nitride or zirconium-titanium alloy nitride is vapor deposited over said zirconium or zirconium-titanium alloy layer.

10. The process of claim 9 wherein a zirconium nitride or zirconium-titanium alloy nitride layer is vapor deposited over said sandwich layer.

11. The process of claim 10 wherein a zirconium oxide or zirconium-titanium oxide layer is vapor deposited over said zirconium nitride or zirconium-titanium alloy nitride layer.

12. The process of claim 11 wherein a layer comprised of the reaction products of zirconium or zirconium-titanium alloy, oxygen and nitrogen is vapor deposited over said zirconium nitride or zirconium-titanium alloy nitride layer.

13. The process of claim 1 wherein said refractory metal is selected from the group consisting of zirconium, titanium and hafnium and said refractory metal alloy is zirconium-titanium alloy.

14. The process of claim 1 wherein said refractory metal compound is selected from the group consisting of nitrides, oxides and reaction products of refractory metal, oxygen and nitrogen, and said refractory metal alloy is selected from the group consisting of nitrides, oxides and reaction products of refractory metal alloy, oxygen and nitrogen.

15. The process of claim 14 wherein said refractory metal compound is selected from the group consisting of zirconium, nitride, zirconium oxide, reaction products of zirconium, oxygen and nitrogen, titanium nitride, titanium oxide, and reaction products of titanium, oxygen and nitrogen, and said refractory metal alloy compound is selected from the group consisting of zirconium-titanium alloy nitride, zirconium-titanium alloy oxide, and reaction products of zirconium-titanium alloy, oxygen and nitrogen.

16. The process of claim 15 wherein said refractory metal compound is selected from the group consisting of zirconium oxide, zirconium nitride, and reaction products of zirconium, oxygen and nitrogen, and said refractory metal alloy compound is selected from the group consisting of zirconium-titanium alloy nitride, zirconium-titanium alloy oxide, and reaction products of zirconium-titanium alloy, oxygen and nitrogen.

17. The process of claim 1 wherein said article is comprised of metal or a metal alloy.

18. The process of claim 17 wherein said article is comprised of brass.

19. The process of claim 1 wherein said article is comprised of plastic.

20. The process of claim 1 wherein said article is a faucet.

21. The process of claim 1 wherein said article is door lock hardware.

22. The process of claim 1 wherein said article is a lamp.

* * * * *